(12) United States Patent
Häussler et al.

(10) Patent No.: US 8,185,369 B2
(45) Date of Patent: May 22, 2012

(54) METHOD AND APPARATUS FOR CHARACTERIZING PROPERTIES OF ELECTRONIC DEVICES DEPENDING ON DEVICE PARAMETERS

(75) Inventors: Robert Häussler, Augsburg (DE);
Harald Kinzelbach, München (DE);
Alfred Lang, Weilheim (DE)

(73) Assignee: Infineon Technologies AG, Munich (DE)

( * ) Notice: Subject to any disclaimer, the term of this patent is extended or adjusted under 35 U.S.C. 154(b) by 1536 days.

(21) Appl. No.: 11/650,649

(22) Filed: Jan. 8, 2007

(65) Prior Publication Data

US 2008/0168297 A1 Jul. 10, 2008

(51) Int. Cl.
*G06F 17/50* (2006.01)
*G06F 9/455* (2006.01)

(52) U.S. Cl. ............ 703/14; 703/19; 716/113

(58) Field of Classification Search ......... 703/14, 703/19; 716/6, 113; 700/95–97, 121
See application file for complete search history.

(56) References Cited

U.S. PATENT DOCUMENTS

| | | | | |
|---|---|---|---|---|
| 6,072,948 A * | 6/2000 | Saitoh et al. | ...... | 703/14 |
| 6,378,109 B1 * | 4/2002 | Young et al. | ...... | 716/4 |
| 6,988,254 B2 * | 1/2006 | Iwanishi et al. | ...... | 716/114 |
| 7,239,997 B2 * | 7/2007 | Yonezawa | ...... | 703/14 |
| 7,325,210 B2 * | 1/2008 | Rao et al. | ...... | 703/16 |
| 7,441,211 B1 * | 10/2008 | Gupta et al. | ...... | 716/2 |
| 2002/0016704 A1 * | 2/2002 | Blanks | ...... | 703/14 |
| 2006/0277511 A1 * | 12/2006 | Agrawal et al. | ...... | 716/6 |
| 2008/0109766 A1 * | 5/2008 | Song et al. | ...... | 716/2 |

OTHER PUBLICATIONS

Chang et al., 2003., "Statistical Timing Analysis Considering Spatial Correlations Using a Single Pert-Like Traversal". 2003 IEEE/ACM international conference on computer-aided design. 5 Pages.*
Robert K. Brayton and Stephen W. Director; Computation of Delay Time Sensitivities for Use in Time domain Optimization; IEE Transactions on Circuits and Systems; Dec. 1975; vol. Cas-22, No. 12.
Hans-Ulrich Armbruster, Uwe Feldmann, Martin Frerichs; Analysis based reduction using sensitivity analysis; pp. 29-32; Infineon Technologies AG; Munich, Germany, 2006.
Chandu Visweswariah; Optimization Techniques for High-Performance Digital Circuits; 1997; IBM Thomas J. Watson Research Center, Yorktown Heights, New York.
Basics; Clock Timing Parameters; pp. 1-9; 2003; Advanced Computer Systems Engineering Lab.

* cited by examiner

*Primary Examiner* — Paul Rodriguez
*Assistant Examiner* — Eunhee Kim
(74) *Attorney, Agent, or Firm* — Eschweiler & Associates, LLC

(57) ABSTRACT

A system and method for obtaining information about an electronic device includes the steps of providing a criterion for a property of the electronic device depending on at least one device parameter, and determining a relationship between variations of the at least one device parameter and variations of the property.

28 Claims, 5 Drawing Sheets

METHOD AND APPARATUS FOR CHARACTERIZING PROPERTIES OF ELECTRONIC DEVICES DEPENDING ON DEVICE PARAMETERS

BACKGROUND OF THE INVENTION

The present invention relates to methods and apparatuses for characterizing properties of electronic devices dependent on device parameters. Furthermore, the invention relates to a library where such properties are stored.

BRIEF DESCRIPTION OF THE DRAWINGS

FIGS. 4A and 4B show simulation results for a setup time, wherein FIG. 4A shows results of a Monte Carlo simulation and FIG. 4B shows a quantile-quantile-plot of the results of FIG. 4A;

FIGS. 5A and 5B show simulation results for the hold time, wherein FIG. 5A shows the results of a Monte Carlo simulation and FIG. 5B shows quantile-quantile-plot of the results of FIG. 5A;

DETAILED DESCRIPTION OF THE INVENTION

In the following, embodiments of the invention will be described with reference to the attached drawings. In order to provide a clearer understanding of the embodiments which will be described, at first some definitions of terms used in the detailed description and some information regarding the environment were embodiments of the invention may be used will be given.

In general, the embodiments which will be described relate to methods and apparatuses for characterizing properties of electronic devices depending on device parameters. In this respect, properties of electronic devices generally relate to the behavior of the devices when used, for example the timing behavior, whereas parameters generally relate to parameters used in the design of the electronic devices. Device parameters may be device parameters directly corresponding to device features, for example gate oxide thickness, gate length, doping profile, threshold current of a transistor and the like, or may be more abstract parameters which for example are functions of the above-listed device parameters which correspond to device features. Examples for device properties are required setup and hold times. Electronic device in the context of this application relates to an entity usable in an electronic circuit, and may be a basic device like a transistor as well as a more complex device which for example may comprise a plurality of transistors and other elements like flip-flops or logic gates.

Modern electric circuits consequently comprise a plurality of such electronic devices, for example millions of transistors. When designing such complex electronic circuits, evaluation techniques based on a description of the circuit like a gate level or transistor level netlist become more and more important in order to be able to evaluate and check the behavior of the circuit as far as possible before the actual physical implementation. One aspect of this evaluation is the so-called timing analysis, where it is basically checked whether a signal arrives at certain circuit elements or electronic devices at a certain time or within a certain time frame which may in turn be determined by other signals like a clock signal. A simple example for this will be explained with reference to FIG. 1.

Figure 1:
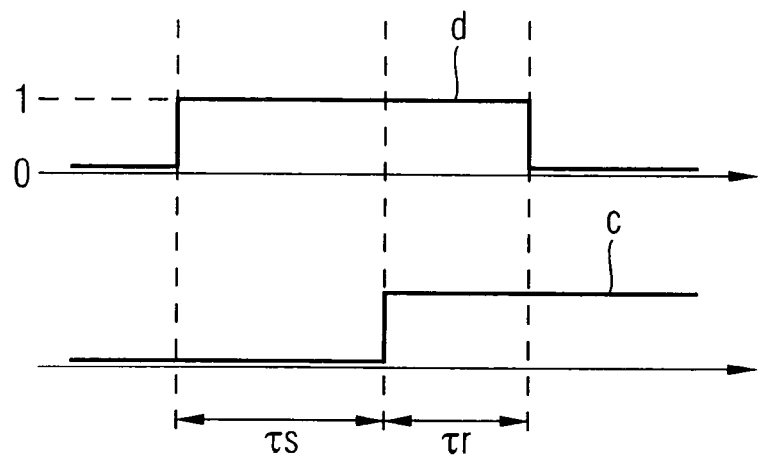
FIG. 1 is a timing diagram.

In FIG. 1 a signal d is shown to be sampled in a register, for example a flip-flop, controlled by a rising edge of a clock signal c. In the example shown, the signal d assumes a logic 1 state a time $\tau_s$ before the rising edge of clock signal c and remains at logic 1 a time $\tau_r$ after said rising edge. Time $\tau_s$ will be called data submission time, while $\tau_r$ will be called data retention time hereinafter.

In order to achieve a correct sampling of signal d in the register, $\tau_s$ has to be at least equal to a certain setup time, while $\tau_r$ has to be at least equal to a certain hold time. Setup time and hold time are examples for the above-mentioned properties of an electronic device, in this case, the register where data signal d is sampled.

It should be noted that sometimes also $\tau_s$ and $\tau_r$ are called setup time and hold time. However, to avoid confusion with the required setup time and required hold time for correct sampling, within this application the above-mentioned names data submission time and data retention time are used, and setup time and hold time designate the required or specified time for correct functioning of the device, i.e. the properties of the device.

For complex electronic circuits, timing analysis conventionally is carried out using so-called static timing analysis which uses some simplifications in order to make it possible to evaluate even large circuits with the computing power currently available. Static timing analysis generally uses a library where properties of electronic devices, in this case usually called cells, making up a circuit are stored, and this information is used during the static timing analysis.

With the increasing miniaturization of electronic devices, the influence of manufacturing or process variations of device parameters like gate oxide thickness, gate length, dopant concentration and the like on the properties of the devices has become more and more important. In order to take such variations of the device parameters into account, statistical static timing analysis (SSTA) has been developed. Statistical static timing analysis is based on static timing analysis and has also capabilities to take statistical variations of timing properties of the electronic devices in the circuit to be evaluated into account, for example delay and slew variations of the cells or devices.

For statistical static timing analysis, it is therefore necessary to incorporate corresponding information into the above-mentioned library which describes the variation of the properties of the cells dependent on variations of the device parameters in some manner.

Embodiments of the invention provide methods and apparatuses for characterizing such properties and the variations thereof depending on device parameters and variations thereof.

According to an embodiment, a criterion is provided for a property in form of an equation, said equation depending on device parameters. Information regarding the variation of the property depending on variations of the parameters is then calculated based on the equation.

The property may be a setup time or a hold time. The equation, in an embodiment of the invention, is an equation defined by functions that are differentiable in a region of interest, for example a region around nominal values of said device parameters. The above-mentioned calculation step in such an embodiment may comprise performing a differentiation operation to obtain sensitivity coefficients.

In an embodiment, said equation comprises a function describing the dependency of a delay from a clock input of the device to a node of said device depending on one of the data submission time and the data retention time. Said node may in particular be a so-called iq node which is an internal flip-flop node before an output driver of the device. In a different embodiment, the node is a node decoupled from the output of the device by an element of the device such that a load applied to the output does not influence said equation.

To provide a further understanding, in the following an embodiment will be described for the characterizing of setup time and hold time depending on device parameters.

The determination of the setup time and the hold time in this embodiment is carried out separately. For the analysis of the setup time, it is assumed that the data retention time $\tau_r$ approaches infinity, and for the determination of hold time or the hold analysis it is assumed that the signal has already arrived a long time before the relevant clock edge, i.e. the data submission time $\tau_s$ approaches infinity. To simplify the notation in the following, a data time $\tau$ is defined as follows:

$$\tau = \begin{cases} \tau s & \text{for setup analysis}(\tau r \to \infty) \\ \tau r & \text{for hold analysis}(\tau s \to \infty) \end{cases}$$

The above-mentioned clock to iq delay mentioned above depends on the data time and will be designated $T(\tau)$ in the following.

In the embodiment, at first the setup and hold times for the nominal case, i.e. the case where the device parameters match nominal parameters which may be given by a device specification, are determined as follows:

The function $T(\tau)$ is determined for example by simulating the clock to iq delay of the device with varying $\tau$. Such a simulation may for example by an analog simulation using a conventional analog simulator.

Additionally, the so-called static clock to iq delay $T_\infty$ is simulated which corresponds to the case where $\tau$ approaches infinity, i.e. $T_\infty \equiv T(\infty)$. In this embodiment, the setup and hold time, respectively, are then derived by requiring that the clock to iq delay for a finite data time, i.e. $\tau < \infty$, must not exceed a predetermined threshold value which is larger than the static delay. This critical threshold value in the embodiment is set to $\alpha T_\infty$ with a predetermined value $\alpha > 1$. The critical or allowed setup or hold time $\tau_0^*$ is defined as the data time (ts and tr, respectively), where this threshold value is just reached. In other words, the setup and hold time is determined as a solution of the equation $$T(\tau_0^*) - \alpha T_\infty = 0 \quad (1)$$

A possible value for $\alpha$ is for example 1.1 or 1.11. It should be noted that $\alpha$ may be different for the setup case and the hold case. In an embodiment, $\alpha$ is chosen such that the register actually works properly in the vicinity of $\tau = \tau_0^*$, which may always be reached by choosing $\alpha$ appropriately.

It should be noted that equation (1) comprises the differentiable function T which facilitates the mathematical treatment.

Up to now, the nominal case with no variations of parameters has been discussed for obtaining a nominal setup or hold time $\tau_0^*$. In the following, the device parameters are denoted $z_1, z_2, \ldots, z_N$. As already mentioned, examples for such device parameters or gate oxide thickness, gate length, dopant concentration, threshold voltages and the like. In general, these device parameters are, from a statistical point of view, correlated random variables with a known covariance matrix. Therefore, these correlations may be modeled starting from independent random base variables or base parameters $\zeta_1, \ldots, \zeta_L$ as stochastic input, wherein the device parameters are functions of these base variables according to $$z_k = z_k(\zeta_1, \ldots, \zeta_L); k = 1, 2, \ldots, N \quad (2)$$

It should be noted that the base variables $\zeta_1, \ldots, \zeta_L$ may not correspond to actual physical values, but may be values which may be derived from the $z_k$ by a basic mathematic transformation named principle axis transformation. As a matter of course, in case the $z_k$ are already independent variables, the $\zeta_n$ may chosen to be identical to the $z_k$. The base variables or base parameters are also to be regarded as device parameters in the sense of the present application as explained above and in particular are an example for more abstract device parameters.

In the currently discussed embodiment, without restriction of generality the base variables $\zeta_l$, $l = 1 \ldots L$ are defined such that the original nominal value $z_{k,0}$ of the device parameter $z_k$, i.e. the parameter without variations, is obtained when the base variables are zero, i.e.

$$z_{k,0} = z_k = (\zeta_1, \ldots \zeta_L)|_{\zeta_1 = 0, \ldots, \zeta_L = 0}; k = 1, \ldots, N \quad (3)$$

Furthermore, the base variables are normalized such that their means are vanishing, $$\langle \zeta_l \rangle = 0 \quad (4)$$

and their variances are given by $$\langle \zeta_l \zeta_m \rangle = \sigma_l^2 \delta_{lm} \quad (5)$$

for $l, m = 1, \ldots, L$. $\sigma_l$ is the standard deviation of $\zeta_l$ and $\delta_{lm}$ is the Kronecker-delta reflecting the fact that the base variables are independent. The angular brackets here and in the following denote the statistical expectation value with respect to the probability distribution of the base variables.

To simplify the notation, in the following the set of base variables is combined to a vector:

$$\vec{\zeta} := (\zeta_1, \ldots, \zeta_L) \quad (6)$$

When the base parameters $\vec{\zeta}$ vary, the clock to iq delay T also varies, i.e. T is a function of these parameters. In other words, $T = (\tau, \vec{\zeta})$ and $T_\infty = T_\infty(\vec{\zeta})$. For non-zero value of the device parameters, equation (1) therefore reads $$T(\tau^*, \vec{\zeta}) - \alpha T_\infty(\vec{\zeta}) = 0 \quad (7)$$

wherein the original or nominal case corresponds to $\vec{\zeta} = 0$. As can be seen from equation (7), now also the setup or hold time $\tau^*$ defined as solution of this equation depends on the base parameters. Variations of the base parameters, i.e., $\vec{\zeta}$ lead to deviations of the setup or hold time from the nominal value. The resulting new value may be written as $$\tau^* = \tau_0^* + \delta\tau^* \quad (8)$$

Inserting equation (8) into equation (7) yields $$T(\tau_0^* + \delta\tau^*, \vec{\zeta}) - \alpha T_\infty(\vec{\zeta}) = 0 \quad (9)$$

A first-order linearization of the terms of equation (9) yields $$T(\tau_0^* + \delta\tau^*, \vec{\zeta}) = T(\tau_0^*) + \delta\tau \frac{\partial}{\partial t}T(t,0)\bigg|_{t=\tau_0^*} + \vec{\zeta}\nabla_\zeta T(\tau_0^*, \vec{\zeta})\bigg|_{\zeta=0} \quad (10)$$

and $$T_\infty(\vec{\zeta}) = T_\infty + \vec{\zeta}\cdot\nabla_\zeta T(\tau_0^*, \vec{\zeta})\big|_{\zeta=0} \quad (11)$$

which may be inserted in equation (7) to result in:

$$0 = \delta\tau^* \frac{\partial}{\partial t}T(t,0)\bigg|_{t=\tau_0^*} + \vec{\zeta}\nabla_\zeta\{T(\tau_0^*, \vec{\zeta}) - \alpha T_\infty(\vec{\zeta})\}\bigg|_{\zeta=0} \quad (12)$$

$\nabla_\zeta$ in this case is defined as the vector $$\nabla_{\vec{\zeta}} = \left(\frac{\partial}{\partial \zeta_1}, \ldots, \frac{\partial}{\partial \zeta_L}\right) \quad (13)$$

Using the definitions $$\vec{\Omega} := \nabla_\zeta\{T(\tau_0^*, \vec{\zeta}) - \alpha T_\infty(\vec{\zeta})\}\big|_{\zeta=0} \quad (14)$$

and $$\omega := \frac{\partial}{\partial t}T(t,0)\bigg|_{t=\tau_0^*} \quad (15)$$

equation (12) as a result for $\delta_\tau^*$ yields:

$$\delta\tau^* = \frac{-\vec{\zeta}\cdot\vec{\Omega}}{\omega} \quad (16)$$

The dot between $\vec{\Omega}$ and $\vec{\zeta}$ denotes the corresponding scalar product. As can be seen, $\vec{\Omega}/\omega$ defines the "sensitivity" of $\tau^*$ to variations of the base variables.

As defined above, the base parameters are independent random variables with zero means and given variances as defined by equations (4) and (5). This implies:

$$\langle\delta\tau^*\rangle = 0 \quad (7)$$

$$\langle(\delta\tau^*)^2\rangle = \frac{1}{\omega^2}\sum_{kl}\Omega_k\Omega_l\langle\zeta_k\zeta_l\rangle = \frac{\vec{\Omega}^2}{\omega^2} \quad (18)$$

The standard deviation $\sigma_\tau$ of the variation of the setup or hold time is therefore given by $$\sigma_\tau = \sqrt{\langle(\delta\tau^*)^2\rangle} = \sqrt{\vec{\Omega}^2/\omega^2} \quad (19)$$

Therefore, according to this embodiment, when $\vec{\Omega}$ and $\omega$ are known, both the sensitivity of $\tau^*$ to variations of the base parameters (equation (15)) and the standard deviation (equation (18)) are given. By then transforming the base parameters $\zeta$ back to the parameters z, also the corresponding information for variations of the device parameters z is known.

In the following, embodiments for determining $\vec{\Omega}$ and $\omega$ will be described.

In the embodiment, at first the nominal setup or hold time $\tau_0^*$ as defined by equation (1) is determined. In an embodiment, this is done by using a bisection iteration. In such an iteration, basically a starting value for $\tau_0^*$ is chosen in the middle between zero and a given maximum value. For this starting value, the left side of equation (1), i.e. basically the clock to iq delay for this starting value, is determined via simulation, and depending on whether the left side of equation (1) is positive or negative the next value of the iteration is set to the middle between zero and the starting value or the middle between the starting value and the predetermined maximum value. This process is repeated until a desired accuracy has been reached, for example until two successive values do not differ by more than a predetermined deviation.

Such a bisection iteration typically requires 15-35 simulation runs.

To determine the value for $\omega$ of equation (15), a plurality of values of $T(\tau)$ is simulated for values of $\tau$ in the vicinity of $\tau_0^*$. The points of $T(\tau)$ thus obtained are fitted with a fitting function, and the derivative is then determined based on this fitting function. In an embodiment, a hyperbola function is used as fitting function, and about 30 data points are simulated.

Finally, for determining $\vec{\Omega}$ the derivatives of T with respect to the base parameters $\zeta$ have to be determined. In an embodiment, numerical differentiations are performed with respect to all L base parameters, which typically need 2L simulation runs. In a different embodiment, the so-called adjoint network approach is used to obtain the required derivatives, also called linear sensitivity coefficients. The adjoint method makes it possible to obtain all the sensitivities with a single simulation run independent on the number of sensitivities, wherein said simulation run in an embodiment takes longer than the simulation runs mentioned above, but with an duration independent on the number of derivatives or sensitivities to be ascertained.

In general, the adjoint method may be understood as an application of Tellegens Theorem. In the adjoint method, an associated circuit called the adjoint circuit is formed with has the same topology as the nominal circuit, in this case the device element or cell the setup and hold times of which are examined, but has different electrical elements. During the adjoint analysis, time runs backward. For obtaining the required sensitivities, waveforms of the original and adjoint circuit are convolved.

The adjoint method itself is a conventional technique, so that no further explanation will be given here.

In an embodiment, carrying out the adjoint method yields the sensitivities with respect to the device parameters $z_k$. However, these may be transformed by the already mentioned principle axis transformation onto the set of base parameters $\zeta_l$. Using such a transformation, the derivatives of $T(\tau_0^*, \vec{\zeta})$ and $T_\infty(\vec{\zeta})$ at $\vec{\zeta}=0$ is obtained using the chain rule $$\frac{\partial T}{\partial \zeta_l}\bigg|_{\zeta_l=0} = \sum_{i=1}^{N}\frac{\partial T}{\partial z_i}\bigg|_{z=z_0}\frac{\partial z_i}{\partial \zeta_l}\bigg|_{\zeta} \quad (20)$$

for l=1, ..., L, wherein the values for $$\left.\frac{\partial z_i}{\partial \zeta_l}\right|_{\zeta=0}$$

follow directly from equation (2), i.e. the relationships between the device parameters $z_k$ and the base parameters $\zeta_l$. Therefore, also $\vec{\Omega}$ may be easily determined using the above-explained techniques.

Therefore, with the embodiments discussed, information regarding the variation of device properties, in particular setup and hold times, depending on device parameters may be obtained and for example stored in a library to be used in statistical static timing analysis.

An embodiment similar to the embodiments discussed above and summarizing them will be discussed with reference to the flow diagram of FIG. 2.

In this embodiment, in step 10 the nominal setup or hold time is determined for example by using the bisection iterations discussed above.

Following this, in step 11 the derivative of the clock to iq delay, i.e. the function $T(\tau)$, with respect to $\tau$ at the nominal setup/hold time $\tau_0^*$ is determined, for example by simulation and fitting $T(\tau)$ as described above.

Figure 2:
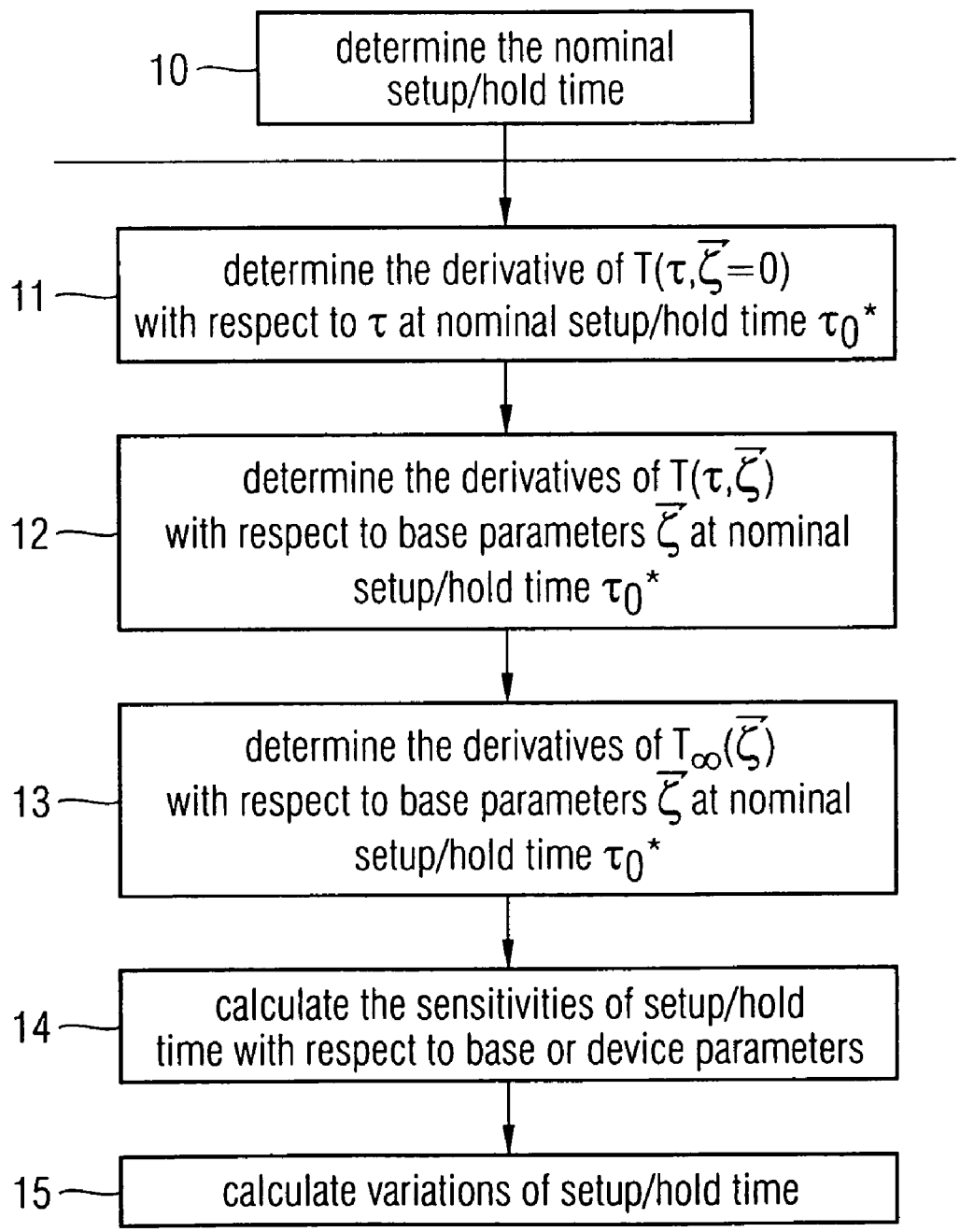
FIG. 2 is a flow diagram of an embodiment of a method according to the present invention.

Following this, in the embodiment of FIG. 2 the derivatives of $T(\tau, \vec{\zeta})$ with respect to the device parameters $\vec{\zeta}$ are determined by the adjoint approach described above. As mentioned above, these derivatives may also be called sensitivities.

In a similar manner, in step 14 the derivatives of the static delay $T_\infty$ with respect to the device parameters $\vec{\zeta}$ are determined. It should be noted that steps 11-13 to not have to be performed in the order shown, but any order is possible.

In step 14 the sensitivities of setup/hold time with respect to the base parameters or the device parameters are calculated using equations (14) and (15). Finally, in step 15 the variations and standard deviations of setup and hold time according to equations (18) and (19) are calculated. As a matter of course, in other embodiments it is possible to only perform step 14 or only perform step 15 depending on which results are of interest. These results may then be stored in a timing library for providing information regarding the electronic device or cell under configuration, and the method according to the embodiment may be repeated for a plurality of different electronic devices or cells to provide information to a complete timing library.

The above-discussed embodiments may in particular be implemented as software in a computer system. A corresponding block diagram of such an apparatus according to an embodiment is shown in FIG. 3.

Figure 3:
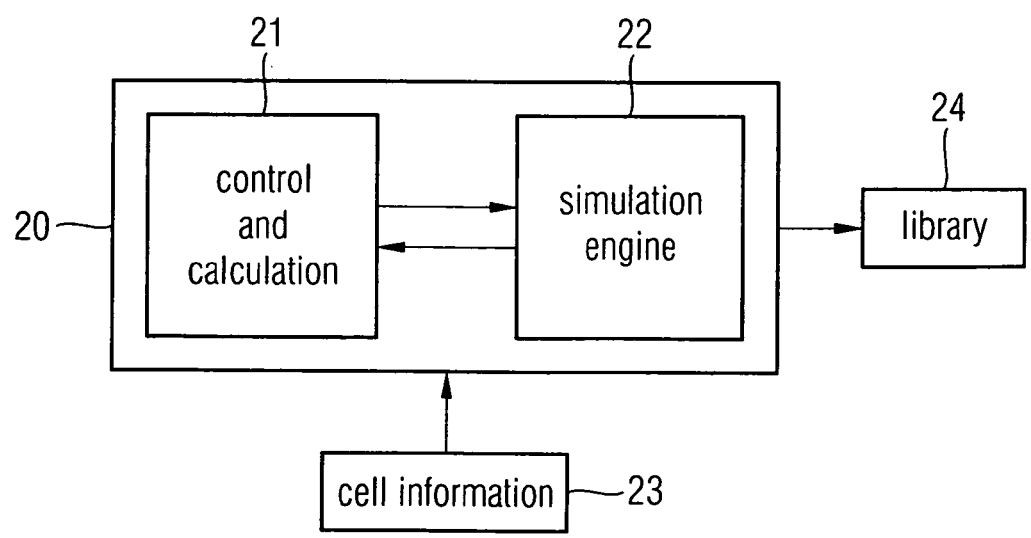
FIG. 3 is a block diagram of an apparatus according to an embodiment of the present invention.

In FIG. 3, a library builder 20 comprises a control and calculation unit 21 interacting with a simulation engine 22. Simulation engine 22 in the embodiment shown is an analog simulator for carrying out the simulations described above including using the adjoint approach method. The control and calculation unit 21 in the embodiment shown performs the necessary calculation and controls simulation engine 22, for example the calculations according to equations (14)-(20).

Information 23 regarding the cell or device to be examined is supplied as shown. Information 23 may be supplied by inserting a storage medium like a CD-ROM into a corresponding computer system or by transfer of the information to a storage of the system via communication means like Ethernet. Information 23 may for example comprise a transistor level netlist for the cell, side constraints, transistor models, simulation parameters and the like. After the method according to an embodiment of the invention has been carried out, in the embodiment shown in FIG. 3 the information obtained is stored in a library 24.

In the following, simulation results according to an embodiment will be presented and compared with results obtained by Monte Carlo simulations. For a Monte Carlo simulation, in general the device is simulated for a plurality of randomly distributed device parameters or base parameters. To obtain satisfying results, of the order of ten thousand simulation runs are needed for a simple flip-flop when both local and global device variations are taken into account. In this respect, local variations are variations which may be different from device to device fabricated on a single wafer, whereas global variations affect all devices on a wafer. As an exemplary device or cell, a 90 nm technology flip-flop at a temperature of about 30° C. has been used.

Figure 4A:
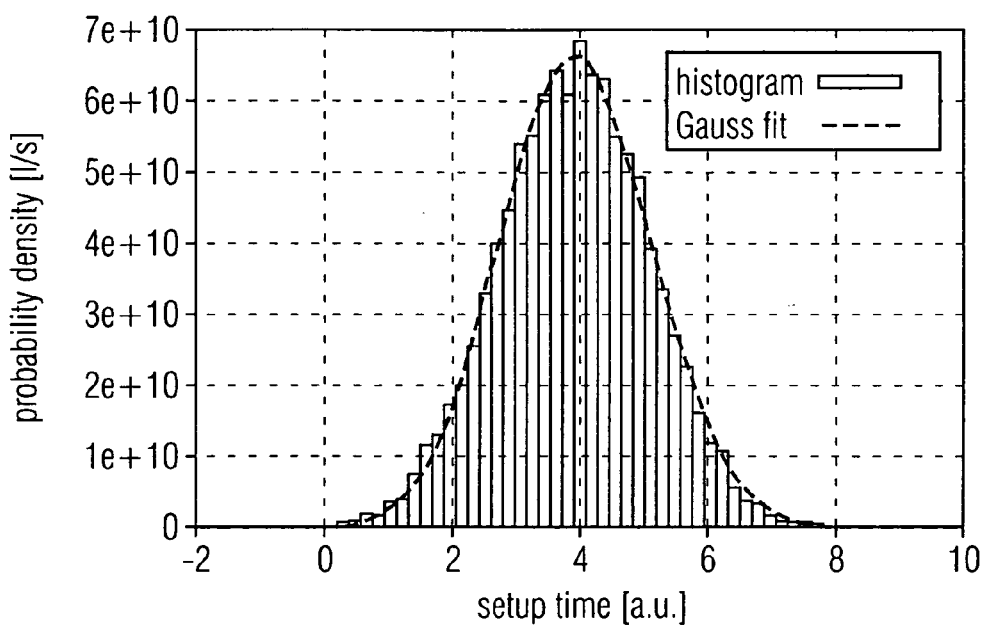
Figure 4B:
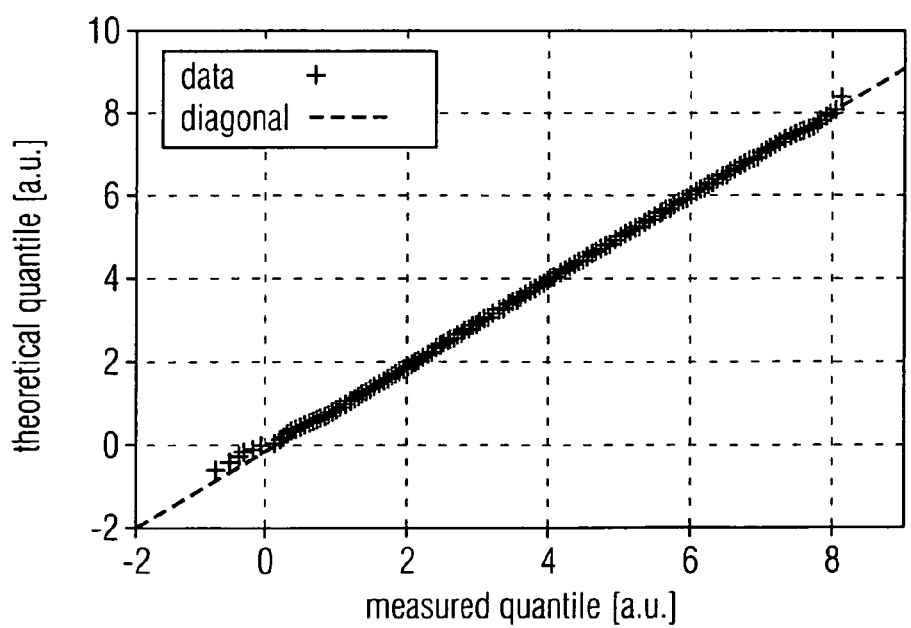

FIG. 4A shows the results of the Monte Carlo simulation for the setup time of this flip-flop, wherein the setup time is given in arbitrary units (a.u.). In this respect, typical setup times of such flip-flops are in the order to 10-30 ps. In the case of FIG. 4A, an average setup time of about 4 a.u. with a standard deviation of 1.20 a.u. resulted. In FIG. 4B, a so-called quantile-quantile plot of the results is shown. That the measured data lies closely to the diagonal shows that the setup time is in good approximation Gaussian distributed.

Figure 5A:
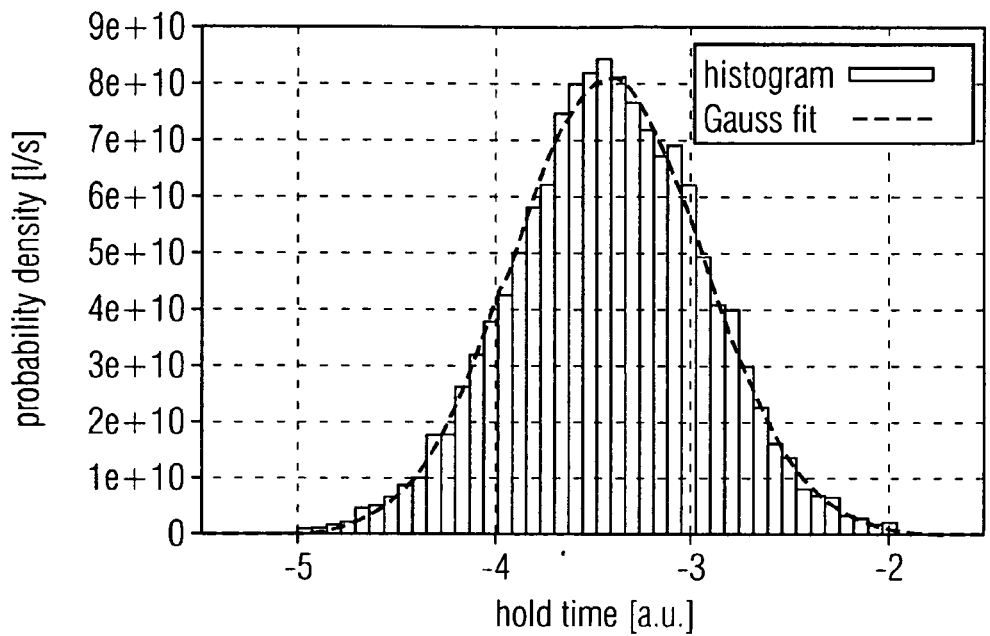
Figure 5B:
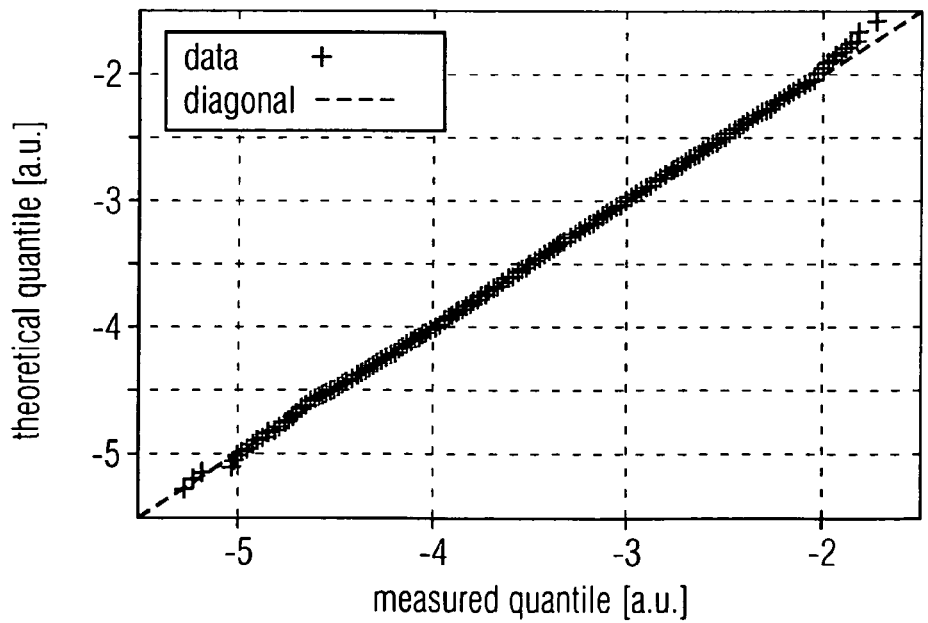

In FIGS. 5A and 5B data similar to FIGS. 4A and 4B for the hold time as determined by a Monte Carlo simulation is shown. Also in typical flip-flops like the one simulated, the hold time is between 10 and 30 ps. In the present case, a hold time of about 1.4 a.u. with a standard deviation of 0.5 a.u. results. These values will be taken as a reference for evaluating the accuracy of the method according to an embodiment of the invention as described above.

The results according to this embodiment will be discussed in the following.

Figure 6:
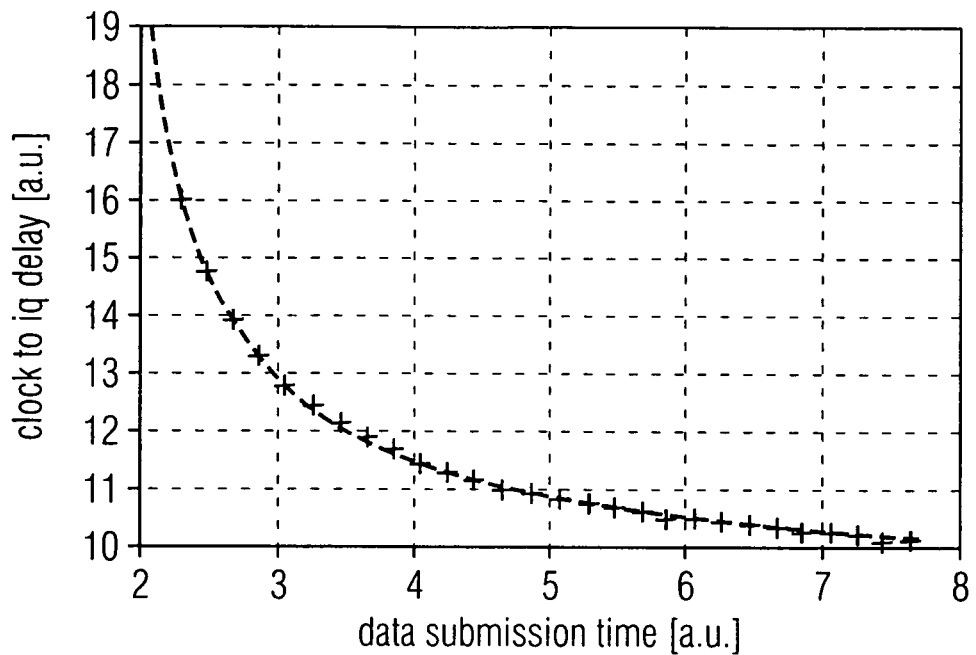
FIG. 6 shows a simulation of clock to iq delay depending on data submission time.

In this respect, FIG. 6 shows a simulation of the clock to iq delay depending on data submission time, i.e. for the setup case, wherein the crosses designate the simulated points as for example simulated in step 11 of the embodiment of FIG. 2, whereas the dashed line represents the result of a fitting with a function $$f(\tau) = \frac{a}{\tau - b} + c \tag{21}$$

The derivative of this function is $$\frac{\partial f(\tau)}{\partial \tau} = \frac{-a}{(\tau - b)^2} \tag{22}$$

and is, with the parameters a, b and c obtained from the fitting, used for determining $\omega$. $\vec{\Omega}$ is determined as described above using an adjoint analysis. The standard deviation calculated according to equation (19) in this case is 1.19 a.u. in very good agreement with the result obtained from Monte Carlo simulation.

Figure 7:
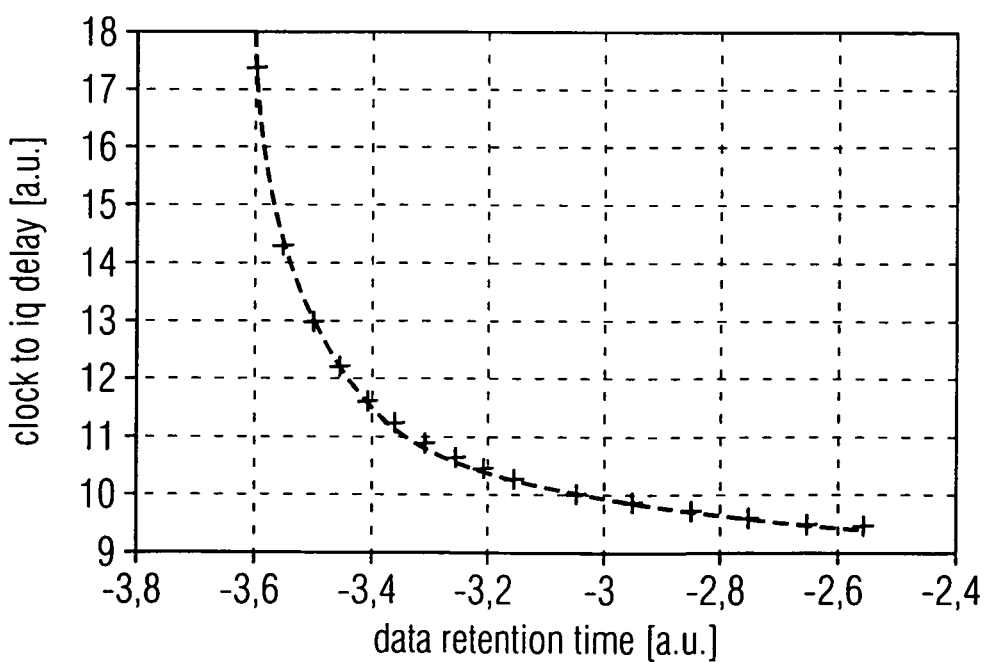
FIG. 7 shows a simulation of clock to iq delay depending on data retention time.

In case of the hold time, FIG. 7 shows a simulation and fitting curve for clock to iq delay depending on data retention time similar to the diagram of FIG. 6. For the hold case, a function $$g(\tau) = \frac{a}{\tau - b} + c\tau + d \quad (23)$$

is used for fitting having a first derivative of $$\frac{\partial g(\tau)}{\partial \tau} = \frac{-a}{(\tau - b)^2} + c \quad (24)$$

which is in turn used for determining ω. In this case, for the standard deviation a value of 0.499 results again in very good agreement with the result obtained from Monte Carlo simulation.

It should be noted that Monte Carlo simulations need considerably more simulation runs for obtaining the result than the embodiments of the present invention discussed. Therefore, with the embodiments shown the characterizing of electronic devices and in particular a plurality of cells of a library may be performed with reduced computational effort compared with Monte Carlo simulations.

As a matter of course, the above embodiments are to be taken as examples only, and variations are possible without departing from the scope of the present invention. For example, in the embodiments discussed as function T for determining the criterion defining the setup or hold time according to equation (1) the clock to iq delay has been used. In other embodiments, other differentiable functions which describe a variation of some quantity depending on data submission or data retention time may be used, for example a clock to output delay or another delay of the circuit which depends on the data submission time or data retention time. Also, in the embodiment in equation (1) the setup or hold time has been defined by a required deviation from the static case $T_\infty$. However, in other embodiments other definitions may be used. These modifications are to be taken as examples only and not as a complete list of all the modifications possible.

The invention claimed is:

1. A method for obtaining information about an electronic device, comprising the steps of:
   providing a criterion comprising an equation for a property of said electronic device depending on at least one device parameter from a storage unit to a processing unit, wherein the at least one device parameter relates to parameters used in the design and manufacture of the electronic device,
   determining a relationship between variations of said at least one device parameter and variations of said property using a calculation unit,
   wherein the property is a setup time or a hold time, and
   wherein determining the relationship comprises calculating derivatives of the equation with respect to at least one of said property and said at least one device parameter using a simulation engine controlled by the calculation unit.

2. The method according to claim 1, further comprising the step of calculating a standard deviation of said property depending on said relationship.

3. The method according to claim 1, further comprising the step of storing information based on said relationship in a library.

4. The method of claim 1, wherein the at least one device parameter relates to transistor parameters of a memory element.

5. A method for obtaining information regarding data time variations of an electronic device, said data time variations depending on variations of at least one parameter of said device, comprising the steps of:
   determining a nominal value of said data time, said nominal value depending on a differentiable function of said data time,
   determining a derivative of said function with respect to the data time at said nominal value,
   determining a further derivative of said function with respect to said at least one parameter of the device at said nominal value,
   determining a sensitivity of said data time with respect to said at least one parameter based on said derivative and said further derivative,
   wherein said data time is one of a setup time and a hold time of a flip-flop,
   wherein the at least parameter of said device relates to parameters used in the design and manufacture of the electronic device.

6. The method according to claim 5, wherein said step of determining said nominal value comprises performing a bisection iteration.

7. The method according to claim 5, wherein said step of determining derivatives of said function with respect to data time comprises a step of simulating values of said function and a step of fitting said values with a fitting function.

8. The method according to claim 7, wherein said fitting function comprises a hyperbolic term.

9. The method according to claim 5, wherein said step of determining the derivative with respect to said at least one parameter comprises performing an adjoint network simulation.

10. The method according to claim 5, wherein said step of determining said derivative with respect to said at least one parameter comprises a numerical differentiation.

11. The method according to claim 5, wherein said function defines the delay from a clock input of said electronic device to a node of said device.

12. The method according to claim 11, wherein said node is decoupled from an output of said device.

13. The method according to claim 5, further comprising the step of calculating a standard deviation based on said sensitivity.

14. The method of claim 5, wherein the at least one device parameter relates to transistor parameters of a memory element.

15. An apparatus for obtaining information about an electronic device, comprising:
   means for providing a criterion comprising an equation for a property of said electronic device depending on at least one device parameter, wherein the at least one device parameter relates to parameters used in the design and manufacture of the electronic device,
   means for determining a relationship between variations of said at least one device parameters and variations of said property, and
   wherein the property is a setup time or a hold,
   wherein said determining means comprises means for calculating derivatives of said equation with respect to at least one of said property and said at least one device parameter.

16. The apparatus according to claim 15, further comprising means for calculating a standard deviation of said property depending on said relationship.

17. The apparatus according to claim 15, further comprising means for storing information based on said relationship in a library.

18. The apparatus of claim 15, wherein the at least one device parameter relates to transistor parameters of a memory element.

19. An apparatus for obtaining information regarding data time variations of an electronic device said data time variations depending on variations of at least one parameter of said device, comprising:
a storage unit comprising information regarding data time variations of an electronic device,
a central processing unit configured to receive the information and to provide the information to a calculation unit configured to determine a nominal value of said data time, said nominal value depending on a differentiable function of said data time, a derivative of said function with respect to the data time at said nominal value, a further derivative of said function with respect to said at least one parameter of the device at said nominal value, and a sensitivity of said data time with respect to said at least one parameter based on said derivative and said further derivative,
wherein said data time is one of a setup time and a hold time, and
wherein the at least parameter of the device relates to parameters used in the design and manufacture of the electronic device.

20. The apparatus according to claim 19, wherein to determine said nominal value said calculation unit performs a bisection iteration.

21. The apparatus according to claim 19, further comprising a simulation engine coupled to said calculation unit to simulate values of said function, wherein for said determining derivatives of said function with respect to data time said calculation unit fits said data values with a fitting function.

22. The apparatus according to claim 21, wherein said fitting function comprises a hyperbolic term.

23. The apparatus according to claim 19, further comprising a simulation engine coupled to said calculation unit to perform an adjoint network simulation to assist said calculation unit in determining the derivative with respect to said at least one parameter.

24. The apparatus according to claim 19, wherein said determining said derivative with respect to said at least one parameter comprises a numerical differentiation.

25. The apparatus according to claim 19, wherein said function defines the delay from a clock input of said electronic device to a node of said device.

26. The apparatus according to claim 25, wherein said node is decoupled from an output of said device.

27. The apparatus according to claim 19, wherein said calculation unit comprises a function to calculate a standard deviation based on said sensitivity.

28. The apparatus of claim 19, wherein the at least one device parameter relates to transistor parameters of a memory element.

* * * * *